(12) United States Patent
Dux et al.

(10) Patent No.: US 12,140,633 B2
(45) Date of Patent: *Nov. 12, 2024

(54) TELEPHONE CONNECTOR TO AUDIO CONNECTOR MAPPING AND LEVELING DEVICE

(71) Applicant: Cyara Solutions Pty Ltd, Hawthorn (AU)

(72) Inventors: Tony Dux, Chermside (AU); Geoff Willshire, Greenslopes (AU)

( * ) Notice: Subject to any disclaimer, the term of this patent is extended or adjusted under 35 U.S.C. 154(b) by 393 days.

This patent is subject to a terminal disclaimer.

(21) Appl. No.: 17/574,091

(22) Filed: Jan. 12, 2022

(65) Prior Publication Data

US 2022/0252666 A1    Aug. 11, 2022

Related U.S. Application Data

(63) Continuation of application No. 16/164,470, filed on Oct. 18, 2018, now Pat. No. 11,255,910.

(51) Int. Cl.
| H04M 3/00 | (2024.01) |
| G01R 31/317 | (2006.01) |
| G01R 31/319 | (2006.01) |
| H02M 3/335 | (2006.01) |
| H04M 5/00 | (2006.01) |

(52) U.S. Cl.
CPC . *G01R 31/31926* (2013.01); *G01R 31/31715* (2013.01); *G01R 31/31721* (2013.01); *G01R 31/31723* (2013.01); *H02M 3/33523* (2013.01)

(58) Field of Classification Search
CPC ........ G01R 31/31715; G01R 31/31721; G01R 31/31723; G01R 31/31926; H02M 3/33523; H01R 2201/16; H01R 31/065; H04M 1/6033; H04Q 1/00; H04R 5/04
See application file for complete search history.

(56) References Cited

U.S. PATENT DOCUMENTS

| 3,258,538 A * | 6/1966 | 061966 | G08C 15/08 |
| | | | 327/411 |
| 2009/0016730 A1* | 1/2009 | Ko | H04B 10/25 |
| | | | 320/132 |
| 2017/0346451 A1* | 11/2017 | De Vries | H04R 3/005 |

* cited by examiner

*Primary Examiner* — Kharye Pope
(74) *Attorney, Agent, or Firm* — Boon Intellectual Property Law, PLLC; Brian S. Boon

(57) ABSTRACT

A system and methods for adaptive bi-direction audio wiring, in which a circuit may be attached via a headset port using RJ9 pin configurations in a phone handset, and dynamically test many different phone handset configurations for optimal audio pathing and processing for speaker and microphone audio generation with minimal noise, static, or power fluctuation.

16 Claims, 13 Drawing Sheets

TELEPHONE CONNECTOR TO AUDIO CONNECTOR MAPPING AND LEVELING DEVICE

CROSS-REFERENCE TO RELATED APPLICATIONS

Priority is claimed in the application data sheet to the following patents or patent applications, the entire written description of each of which is expressly incorporated herein by reference in its entirety:

Ser. No. 16/164,470

BACKGROUND OF THE INVENTION

Field of the Art

The disclosure relates to the field of telecommunication devices, and more specifically the field of automated mapping and leveling of telephone connector pins to audio connector pins.

Discussion of the State of the Art

Modern telecommunications devices use two primary types of connectors. Telephone connectors connect telephone equipment to a handset, and audio connectors connect audio equipment to headphones and headsets. Particularly in cases where phone conversations are frequent (for example, call centers), it is desirable to use a headset in place of a handset. However, telephone equipment uses telephone connectors as standard, whereas audio headsets use audio connectors as standard. Therefore, use of an audio headset with telephone equipment requires an adapter. While the physical configuration for the two types of connectors is standardized, the mapping of the pins for each connector is different for each different manufacturer of telephone equipment and headsets. Thus, headsets from certain manufacturers will not work with the telephone equipment of other manufacturers. Some specialized adaptor cables are available, but have fixed mappings, and thus are limited to adapting one particular audio device configuration to one particular telephony equipment device configuration.

What is needed is a configurable or automated device that easily adapts a wide range of telephone audio devices for use with a wide range of telephone equipment.

SUMMARY OF THE INVENTION

Accordingly, the inventor has conceived and reduced to practice a device and method easily adapts a wide range of telephone audio devices for use with a wide range of telephone equipment using circuitry that maps the signals from telephone connector pins to the corresponding audio connector pins and provides automated line testing and leveling for each pin. The following non-limiting summary of the invention is provided for clarity, and should be construed consistently with embodiments described in the detailed description below.

According to a preferred embodiment, a device for adapting telephone connectors to audio connectors is disclosed, comprising: a plurality of multiplexers capable of interfacing with a controller, a plurality of potentiometers capable of interfacing with a controller, an telephone connector socket; an audio connector socket; and a controller comprising a processor, a memory, and a plurality of programming instructions, wherein the programming instructions, when acting on the processor, cause the controller to: receive a configuration for mapping of pins between a telephone connector and an audio connector, configure the plurality of multiplexers to map electrical signals between each pin of the telephone connector and the corresponding pin of the audio connector, based on the configuration; and configure the plurality of potentiometers to adjust the impedance of the electrical signals between each pin of the telephone connector and the corresponding pin of the audio connector, based on the configuration, whereby signals received at any pin of a connection at one end of the device will be passed through to the corresponding pin of a connection at the other end of the device based on the selected configuration.

According to another preferred embodiment, an automated device for adapting telephone connectors to audio connectors is disclosed, comprising: a plurality of multiplexers capable of interfacing with a controller, a plurality of potentiometers capable of interfacing with a controller, an telephone connector socket; an audio connector socket; and a controller comprising a processor, a memory, and a plurality of programming instructions, wherein the programming instructions, when acting on the processor, cause the controller to: detect electrical signals from a connection at a telephone connector socket; cycle through configurations for mapping of electrical signals from the telephone connector to an audio connector, configure the plurality of multiplexers to map electrical signals between each pin of the telephone connector and the corresponding pin of the audio connector, based on the currently-selected configuration; and configure the plurality of potentiometers to adjust the impedance of the electrical signals between each pin of the telephone connector and the corresponding pin of the audio connector, based on the current configuration cycle; test the current configuration for connectivity and signal quality at each pin; and select the most appropriate configuration, whereby, when a connections are made to the telephone connector socket and the audio connector socket of the device, the device will automatically determine the correct configuration for the connected devices, and signals received at any pin of a connection at one end of the device will be passed through to the corresponding pin of a connection at the other end of the device based on the determined configuration.

A method for adapting telephone connectors to audio connectors is disclosed, comprising the steps of: receiving, at a controller, a configuration for mapping of pins between a telephone connector and an audio connector, configuring a plurality of multiplexers to map electrical signals between each pin of the telephone connector and the corresponding pin of the audio connector, based on the configuration; and configuring a plurality of potentiometers to adjust the impedance of the electrical signals between each pin of the telephone connector and the corresponding pin of the audio connector, based on the configuration, whereby signals received at any pin of a connection at one end of the device will be passed through to the corresponding pin of a connection at the other end of the device based on the selected configuration.

A method for automatically adapting telephone connectors to audio connectors is disclosed, comprising the steps of: detecting electrical signals from a connection at a telephone connector socket; cycling through configurations for mapping of electrical signals from the telephone connector to an audio connector, configuring the plurality of multiplexers to map electrical signals between each pin of the telephone connector and the corresponding pin of the audio connector, based on the currently-selected configuration; and configuring the plurality of potentiometers to adjust the impedance of the electrical signals between each pin of the telephone connector and the corresponding pin of the audio connector, based on the current configuration cycle; testing the current configuration for connectivity and signal quality at each pin; and selecting the most appropriate configuration, whereby, when a connections are made to the telephone connector socket and the audio connector socket of the device, the device will automatically determine the correct configuration for the connected devices, and signals received at any pin of a connection at one end of the device will be passed through to the corresponding pin of a connection at the other end of the device based on the determined configuration.

According to an aspect of an embodiment, a configuration test module generates audio test signals between each pin of a connection at one end of the device, and confirms the receipt and quality of the signal at the pin other end of the device corresponding to the configuration.

According to an aspect of an embodiment, an audio signal generator generates audio test signals in the appropriate direction between each pin of the connection at the telephone connector socket and the corresponding pin at the audio connector socket based on the selected configuration, and confirms the receipt and quality of the signal at the other end of the connection in each pin corresponding with the configuration, wherein the generation and confirmation of audio signals assists the controller in confirming the appropriate selection of configurations.

According to an aspect of an embodiment, an audio line driver is connected to the multiplexers, for the purpose of separating either input signal received, into a balanced output pair, using differential output amplification.

According to an aspect of an embodiment, a DC-to-DC converter regulates input power to a constant voltage in the circuit and provides galvanic isolation for the ground line in the circuitry, to avoid problems due to dirty power and avoid AC hum.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION

Figure 1:
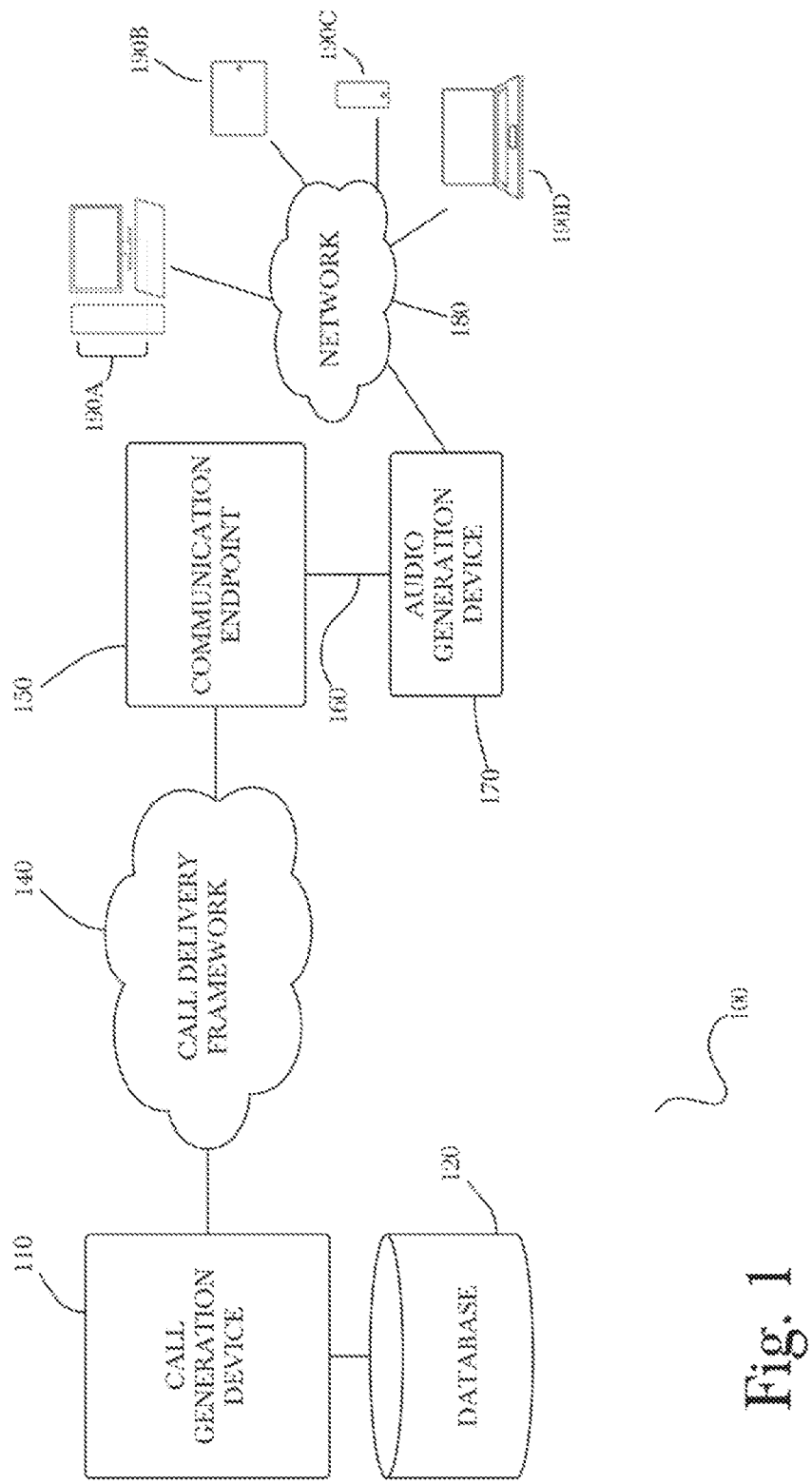
FIG. 1 is a block diagram illustrating an exemplary architecture for a telephony system that uses a call generation device, a call delivery framework, a communication endpoint for receiving a call, and an audio generation device connected to the communication endpoint to facilitate automated testing protocols and sequences, according to a preferred embodiment of the invention.

The inventor has conceived, and reduced to practice, a device that easily adapts a wide range of headsets for use with a wide range of telephone equipment using circuitry that maps the signals from telephone connector pins to the corresponding audio connector pins and provides automated line testing and leveling for each pin.

Definitions

The term "telephone connector" as used herein means any connector used to connect a telephone or telephone equipment to a device containing speakers for outputting audio, a microphone for inputting audio, or both. This term includes, but is not limited to RJ9, RJ10, RJ22: 4P4C or 4P2C, modular jacks currently in use for telephone handsets.

The term "audio connector" as used herein means any connector used to connect audio equipment to a device containing speakers for outputting audio, a microphone for inputting audio, or both. Audio connectors are often called phone connectors, phone jacks, audio jacks, headphone jacks, and jack plugs, the most common sizes of which are 2.5 mm, 3.5 mm, and ¼ inch. The term "audio connector" includes, but is not limited to, audio connectors of types TS, TRS, TRRS, or TRRRS, where "T" stands for "tip", R stands for "ring", and "S" stands for "sleeve".

The term "socket" as used herein means a receptacle for connecting a telephone connector or an audio connector.

The term "pin" as used herein means the end of a wire, or an attachment to the end of a wire, that makes an electrical connection by physical contact with another pin, wire, or electrical component.

The term "line" as used herein means the wire connected to a pin through which electrical signals are transmitted.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the tide of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

One use case for the system and method described herein is to adapt proprietary audio testing equipment that uses audio connectors for use with a range of telephone equipment that uses telephony connectors. In this use case, the lines from the audio testing equipment connectors (for example, TRS/TRRS/TRRRS) will be automatically mapped to the corresponding lines on the telephony connectors (for example, RJ9). The proprietary audio equipment can thus be easily and quickly connected to telephony equipment from a variety of manufacturers without having to use purpose-built, hardwired cables or adapters. It can be seen that such use would allow for a much greater efficiency in testing telephony equipment using proprietary audio testing equipment. It will be readily apparent to one with ordinary skill in the art that other use cases may be possible for the use of the invention described herein, and a specific use of this invention such as described previously is not limiting on the invention in any way.

Conceptual Architecture

FIG. 1 is a block diagram illustrating an exemplary architecture for a telephony system 100 that uses a call generation device 110 with access to a datastore 120, a call delivery framework 140, a communication endpoint 150 for receiving a call, such as, for example, a computing sound device or a telephone turret, an audio generation device 170 connected to communication endpoint 150 via a specially made connection 160 such that testing protocols and sequences may be automatically executed in a live environment, to test the call delivery framework 140 or associated components in a simulated call originating from cither end of the telephony system 100, according to a preferred embodiment of the invention. The call generation device 110 may place a call over the call delivery framework 140 to the audio generation device 170 by initiating protocols to direct the communication endpoint 150 to automatically answer and connect the call to the audio generation device 170. Conversely, the audio generation device 170 may place a call to the call generation device 110 by initiating protocols to direct the communication endpoint 150 to initiate a call within the call delivery framework 140, directed to the call generation device 110. The audio generation device 170 may be connected to system 100 to facilitate an automatic Mean Opinion Score calculation. The audio generation device 170 may be connected to a local administrative network 180, which may be, for example, an in-band audio signaling network for basic functions such as device reboot or an adjunct IP network (wired Ethernet or WiFi) established for administrative purposes or onsite troubleshooting using administrative tools such as computing devices 190A/B/C/D. Typically, administrative tools 190A/B/C/D may not be accommodated on a network supporting the call delivery framework 140, hence may need a separate network 180 to access the audio generation device 170 without needing to obtain access permissions for the call delivery framework 140.

It should be appreciated that according to the embodiment, various means of connection or communication between the components of system 100 may be utilized according to the invention interchangeably or simultaneously, such as for example a direct, physical data connection (such as via a data cable or similar physical means), a software-based connection such as via an application programming interface (API) or other software communication means (such as may be suitable, for example, in arrangements where multiple system components may operate on a single hardware device such as a computing server or workstation), or any of a variety of network connections such as via the Internet or other data communications network. It should therefore be appreciated that the connections shown are exemplary in nature and represent only a selection of possible arrangements and that alternate or additional connections may be utilized according to the invention.

Figure 2:
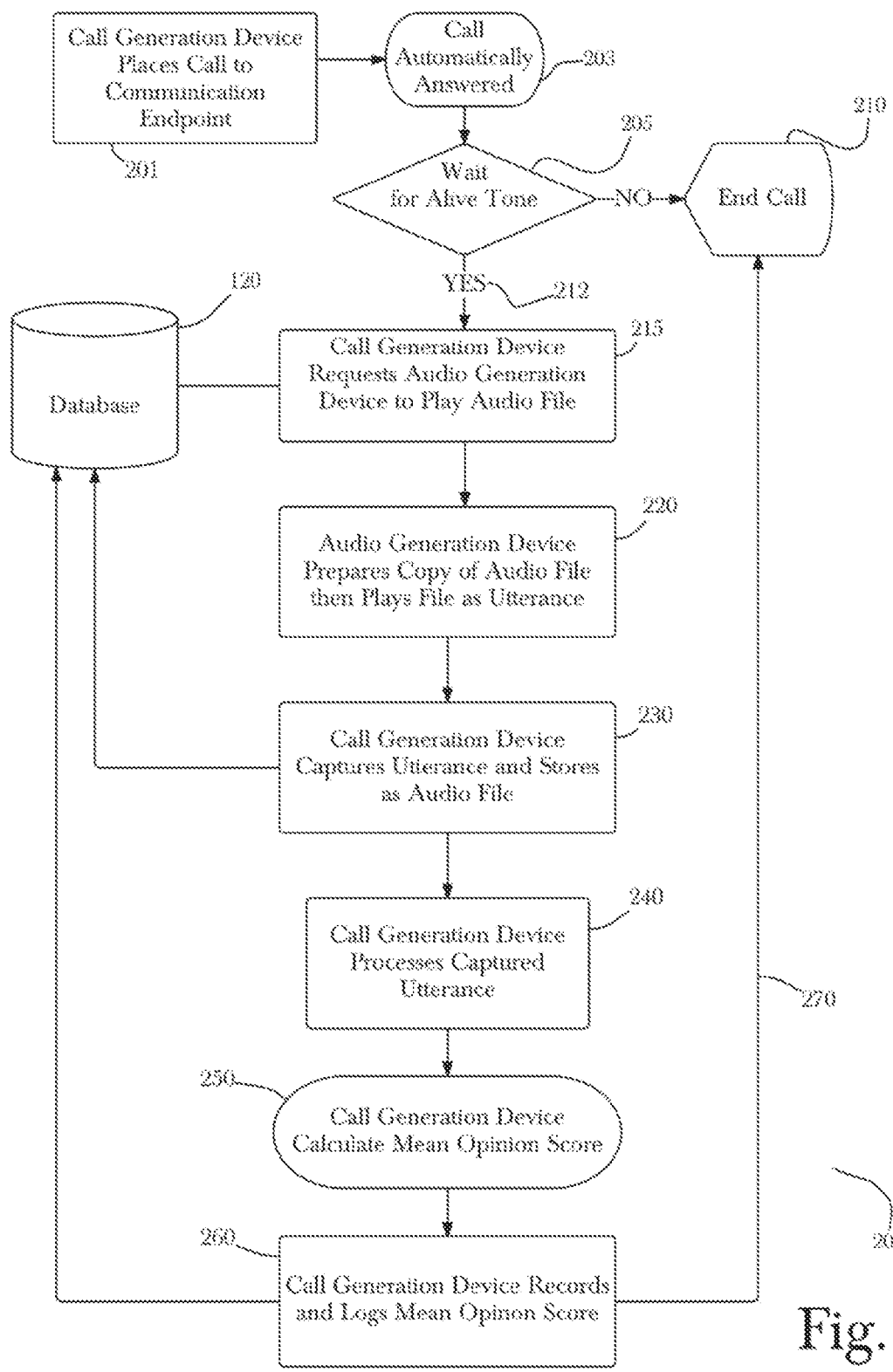
FIG. 2 is a process flow diagram of a method for determining a Mean Opinion Score for a call experience, using a system of the invention.

FIG. 2 is process flow diagram illustrating an exemplary method 200 for testing a system 100 in both directions: upstream from audio generation device 170 to call generation device 110, and downstream from call generation device 110 to audio generation device 170, in both cases, via a dedicated communication endpoint 150 connected to a call delivery framework 140. In a preferred embodiment of the invention, call generation device 110 sends known commands to audio generation device 170 by playing tones of differing frequencies to identify and execute commands, such as changing volume settings of communication endpoint 150, preparing audio generation device 170 to capture an audio file, processing an audio file to calculate a quality score, and/or initiating a soft or hard reboot of methods 200/300. Audio generation device 170 may be configured to play an alive tone 425/525 at predetermined intervals, for example, every 10 seconds, to alert call generation device 110 that audio generation device 170 is available, in an idle position, awaiting commands. In a preferred embodiment of the invention, call generation device 110, connected to system 100, places a call to communication endpoint 201, communication endpoint answers call automatically 203, waits for alive tone 205 and if no tone is received, may terminate the call 210. In such a case, the process may start again. Once an alive tone 425/525 is confirmed 212, call generation device 110 requests audio generation device to play 215 a predetermined reference audio file 469 which matches one stored in datastore 120. Reference audio file 469 is stored on audio generation device 170, which prepares a copy of audio file 469 then plays audio fic 469 as an utterance 220. Call generation device 110 receives, captures, and stores 230 reference audio file 469 to process by comparing the transmitted audio file 469 to its matching counterpart as stored in datastore 120. The call generation device 110 processes the captured reference audio file 469 as an utterance 240 such that an experience score as a Mean Opinion Score (MOS) may be calculated 250 by the call generation device 110, in accordance with a prescribed full reference algorithm as a function of PESQ score mapping. Call generation device 110 records and logs a Mean Opinion Score 260, and may store it in datastore 120 before terminating the call 270.

Figure 3:
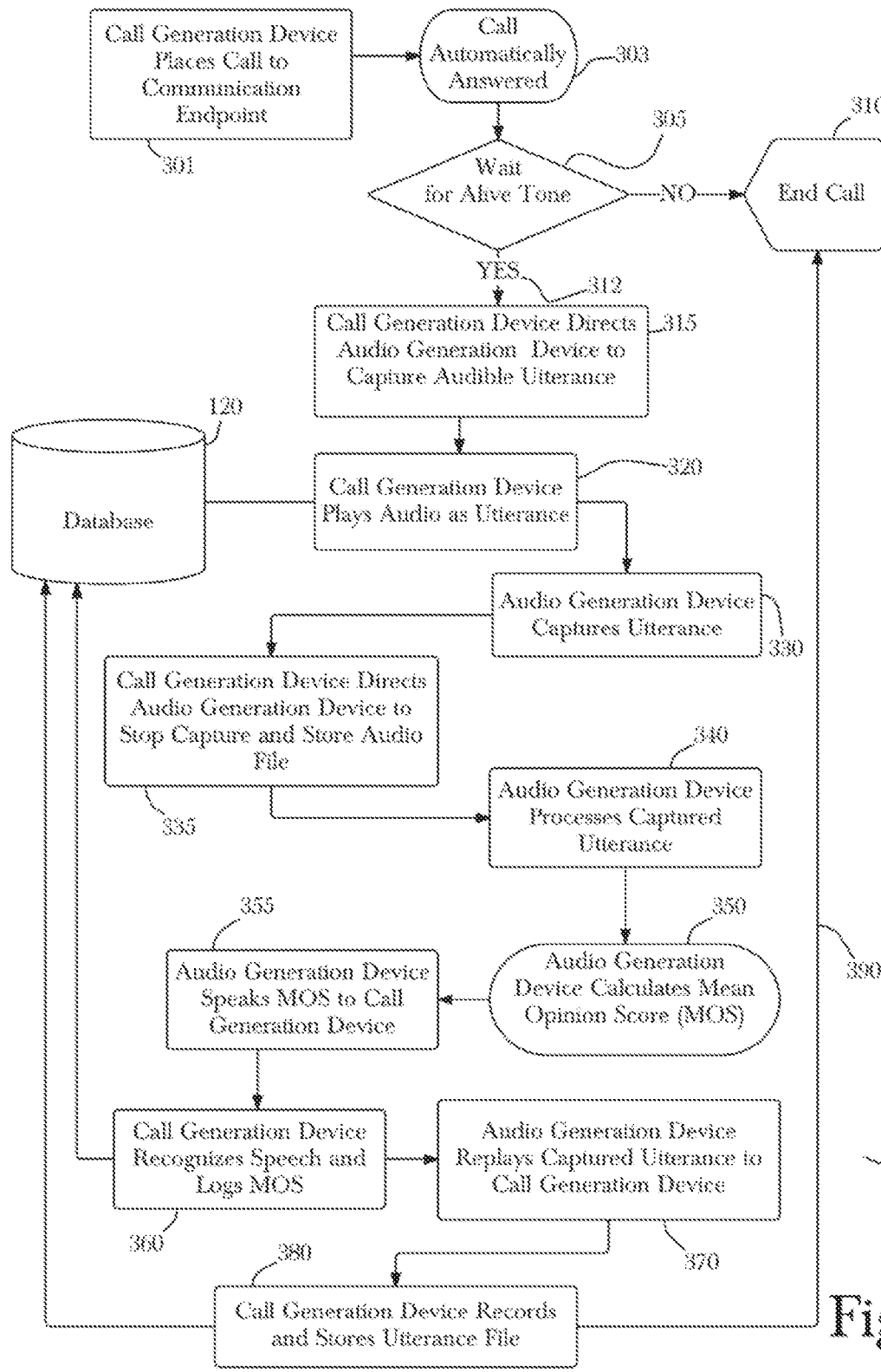
FIG. 3 is another process flow diagram of a method for determining a Mean Opinion Score for a call experience, using a system of the invention.

FIG. 3 is another process flow diagram illustrating an exemplary method 300 for testing a system 100 in both directions: upstream from audio generation device 170 to call generation device 110, and downstream from call generation device 110 to audio generation device 170, in both cases, via a dedicated communication endpoint 150 connected to a call delivery framework 140. In a preferred embodiment of the invention, call generation device 110 places a call 301 to communication endpoint 150, which automatically answers the call 303, waits for alive tone 305 and if no tone is received, may terminate the call 310. In such a case, the process may start again. Once an alive tone 425/525 is confirmed 312, call generation device 110 directs audio generation device 170 to capture an audible utterance 315. Call generation retrieves audio file from datastore 120, plays audio as an utterance 320, then audio generation device captures the utterance 330. Call generation device directs audio generation device to stop capturing audio and store the captured audio file 335, then to process the captured utterance 340 such that the audio generation device 170 may calculate a Mean Opinion Score (MOS) 350, in order to speak the result 355 back to the call generation device 110. The call generation device 110 recognizes the speech and logs the MOS result 360 into datastore 120. Audio generation device 170 replays the captured utterance 370 to the call generation device 110, and the call generation device 110 records and stores the utterance file 380 in datastore 120, before terminating the call 390.

Figure 4:
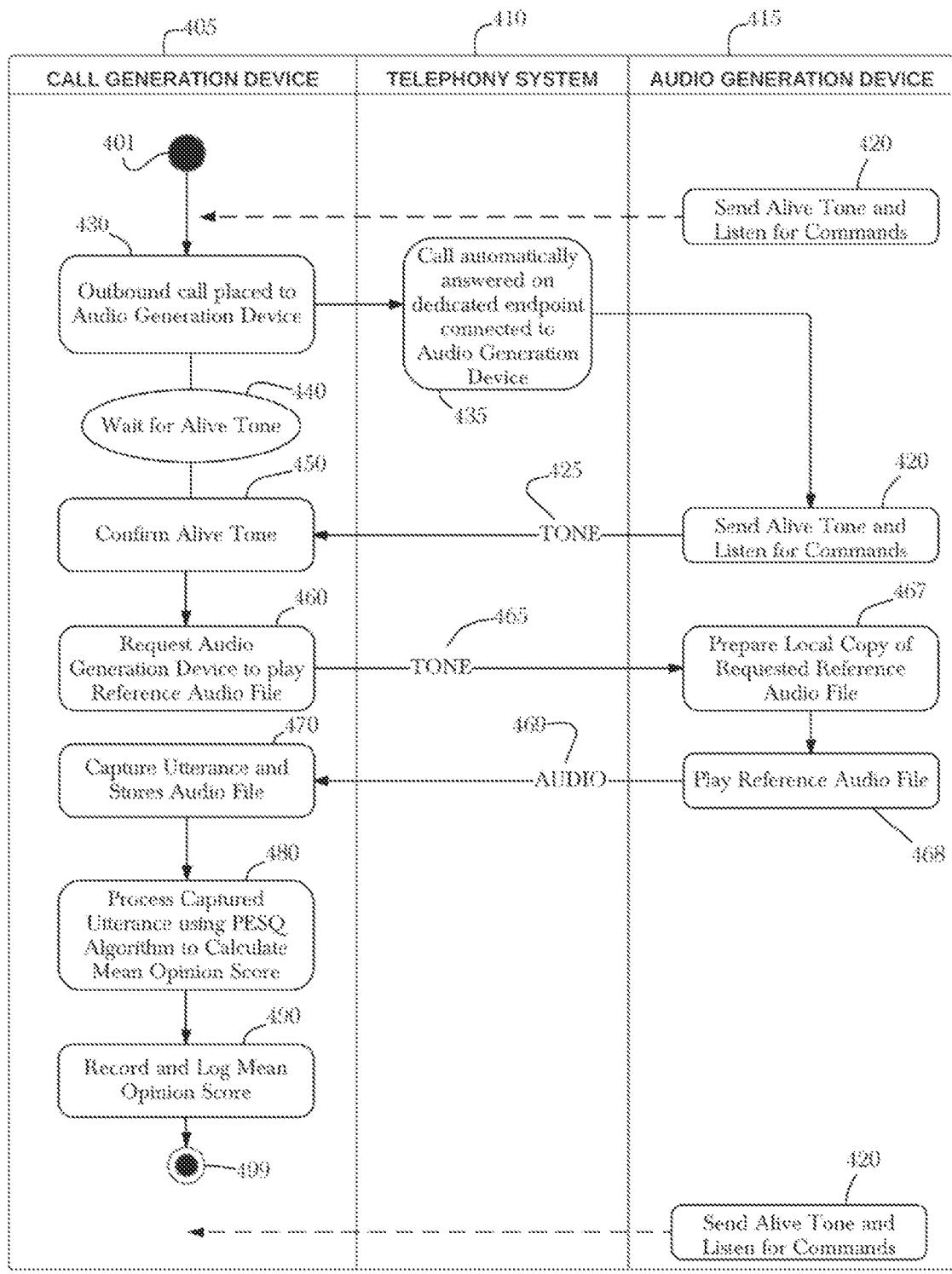
FIG. 4 is an exemplary state transition diagram illustrating a plurality of events that may occur in one or more possible stages during a downstream test sequence, according to a preferred embodiment of the invention.

FIG. 4 is exemplary state transition diagram 400 illustrating a plurality of stages of a Mean Opinion Score determination in an upstream direction, meaning a perceived quality of experience from audio generation device 415 via telephony system 410 to call generation device 405. Audio generation device 415 plays an alive tone and listens for commands 420 at predetermined intervals. Even though a call may start 401 by call generation device 405 for the purpose of measuring an inbound or upstream MOS, call generation device 405 establishes a connection with audio generation device 415 before generating an outbound call 430 from call generation device 405 to audio generation device 415, which is automatically answered on a dedicated communication endpoint 435 connected within telephony system 410. As connection is established, call generation device 405 waits 440 for alive tone 425, confirms receipt 450 of alive tone 425, before requesting audio generation device 415 to play a predetermined reference audio file 460 in order to compare original file quality and respective audible utterance to compare degradation. The request to play a predetermined audio file 460 originates as a tone 465 which signals audio generation device 415 to retrieve a local copy of the predetermined audio file 460 from its local memory, and prepare local copy of requested reference audio file 467 for playback. Audio generation device 415 audibly plays local copy of reference audio file 468 over telephony system 410 as an audible file 469. Call generation device 405 captures audio file 469 as it would have been heard, an utterance 470, processes captured utterance using PESQ algorithm to calculate Mean Opinion Score 480, then records and logs MOS result 490 before terminating the call 499.

Figure 5:
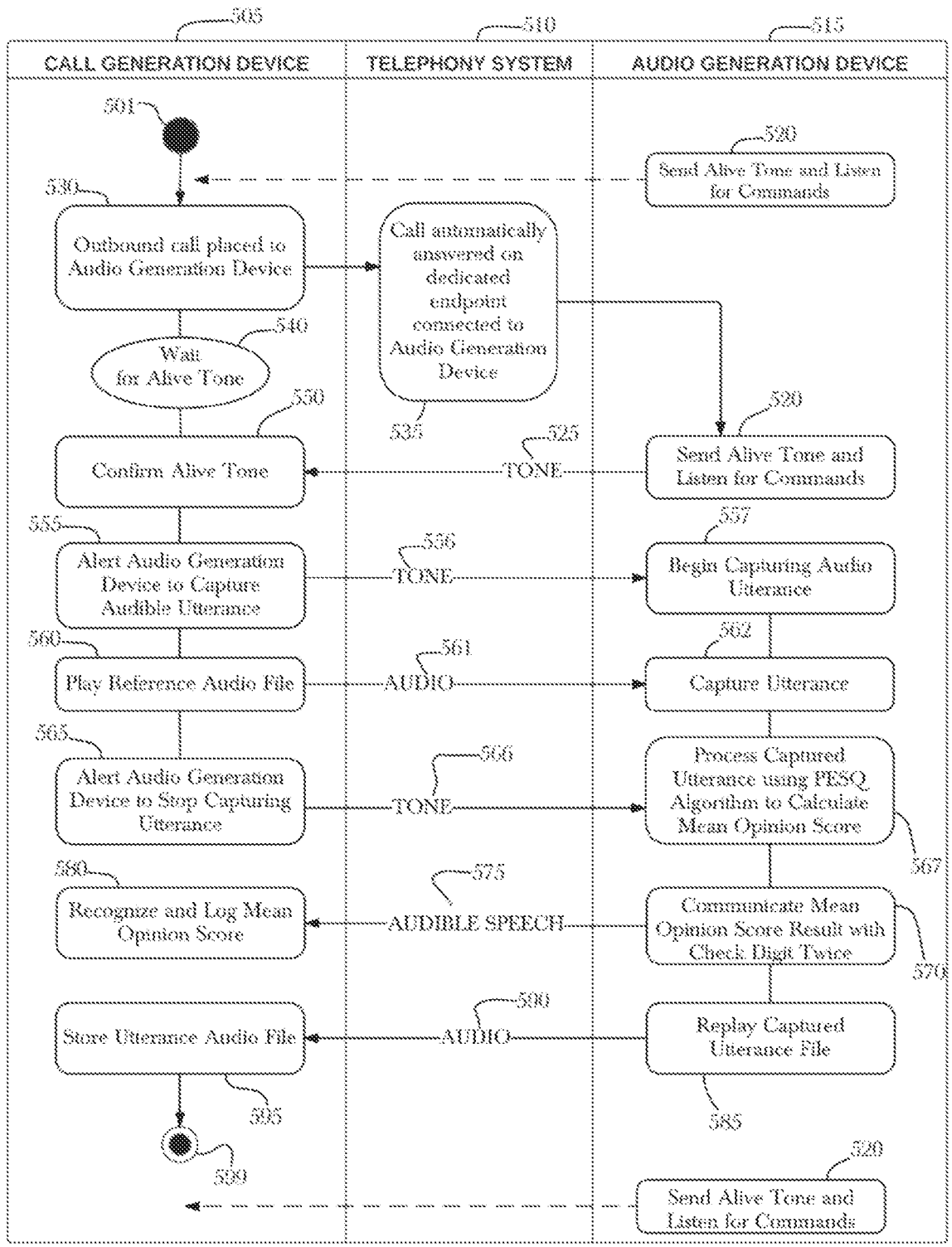
FIG. 5 is an exemplary state transition diagram illustrating a plurality of events that may occur in one or more possible stages during an upstream test sequence, according to a preferred embodiment of the invention.

FIG. 5 is another exemplary state transition diagram 500 illustrating a plurality of stages of a Mean Opinion Score determination in a downstream direction, meaning a perceived quality of experience from call generation device 505 via telephony system 510 to audio generation device 515. Audio generation device 515 plays an alive tone and listens for commands 520 at predetermined intervals. Even though a call may start 501 by call generation device 505 for the purpose of measuring an outbound or downstream MOS, call generation device 505 establishes a connection with audio generation device 515 before generating an outbound call 530 from call generation device 505 to audio generation device 515, which is automatically answered 535 on a dedicated communication endpoint connected within telephony system 510. As connection is established, call generation device 505 waits 540 for alive tone 525, confirms receipt 550, and by playing a tone 556, alerts audio generation device to capture an audible utterance 555. Upon receipt of tone 556, audio generation device 515 begins capturing utterance 557 while call generation device 505 plays reference audio file 560 as an audible speech-like sound 561. Audio generation device 515 captures audio file 561 as an utterance 562 then processes the captured utterance file 562 to calculate a Mean Opinion Score using PESQ algorithm 567. Audio generation device 515 communicates the MOS result with check digit twice 570 by playing an audible speech file 575 speaking the MOS results back to call generation device 505, where results are recognized and logged 580 by the call generation device 505. Audio generation device 515 replays captured utterance file 585 as an audio file 590 back to call generation device 505 which stores 595 utterance file 590 before terminating the call 599.

Call generation device 110 may wait for audio generation device 170 to become idle before alerting it to capture an audible utterance. Call generation device 110 may wait for a plurality of time intervals, which in this particular example, may equate to multiples of ten seconds, to confirm availability. When audio generation device 170 confirms its availability, call generation device 110 plays a reference file 561 then alerts audio generation device 170 to stop capturing and store audio file 561 as an utterance file 565, and produce a tone 566 sent to the audio generation device to inform of the cessation of audio capture. Audio generation device 170 sends 265 utterance file 562 back upstream to call generation device 110, which is waiting 270 until it is received to compare files 561 to 562 to calculate a Mean Opinion Score.

Tones and remote commands executed between call generation device 110/405/505 and audio generation device 170/415/515 operate in a series of frequencies, with each frequency tone representing a specific command, as detailed in table 2300 some key functions include a secondary (lower) tone frequency in case of traversing telephony devices that attempt to filter high frequency tones (shriek rejection):

| Mark | Command Line | Frequency (Hertz) | Action |
| --- | --- | --- | --- |
| 2301 | REQUEST-GET VOLUME | 1400/550 | AGD responds with current volume level of AGD |
| 2302 | REQUEST-VOLUME-UP | 1300/600 | AGD increases persistent volume by one increment |
| 2303 | REQUEST-VOLUME-DOWN | 1350/650 | AGD decreases persistent volume by one increment |
| 2304 | PREPARE-FOR-REFERENCE | 1000/500 | AGD prepares to capture then process against a default, predetermined audio reference file (reference.wav) |
| 2305 | PREPARE-FOR-REFERENCE-A | 1050 | AGD prepares to capture then process against an alternate audio reference file (reference-alt-a.wav) |
| 2306 | PREPARE-FOR-REFERENCE-B | 1075 | AGD prepares to capture then process against an alternate audio reference file (reference-alt-b.wav) |
| 2307 | PREPARE-FOR-REFERENCE-C | 1150 | AGD prepares to capture then process against an alternate audio reference file (reference-alt-c.wav) |
| 2308 | PREPARE-FOR-REFERENCE-D | 1200 | AGD prepares to capture then process against an alternate audio reference file (reference-alt-d.wav) |
| 2309 | PREPARE-FOR-REFERENCE-E | 2045 | AGD prepares to capture then process against an alternate audio reference file (reference-alt-e.wav) |
| 2310 | END-OF-REFERENCE | 1500/800 | AGD stops capturing degraded audio, processes captured utterance, responds with MOS result, replays captured audio. |
| 2311 | PLAY-REFERENCE | 1750/750 | AGD plays default reference audio file (reference.wav) to be captured and processed for degradation by call generation device. |
| 2312 | PLAY-REFERENCE-A | 1800 | AGD plays an alternate reference audio (reference-alt-a.wav) to be captured and processed for degradation by call generation device. |
| 2313 | PLAY-REFERENCE-B | 1850 | AGD plays an alternate reference audio (reference-alt-b.wav) to be captured and processed for degradation by call generation device. |
| 2314 | PLAY-REFERENCE-C | 1900 | AGD plays an alternate reference audio (reference-alt-c.wav) to be captured and processed for degradation by call generation device. |
| 2315 | PLAY-REFERENCE-D | 1950 | AGD plays an alternate reference audio (reference-alt-d.wav) to be captured and processed for degradation by call generation device. |

-continued

| Mark | Command Line | Frequency (Hertz) | Action |
|---|---|---|---|
| 2316 | PLAY-REFERENCE-E | 2000 | AGD plays an alternate reference audio (reference-alt-c.wav) to be captured and processed for degradation by call generation device. |
| 2317 | REQUEST-REBOOT-SOFT | 2100 | For administration purposes only, AGD will attempt to close running processes and reboot. |
| 2318 | REQUEST-REBOOT-HARD | 2150 | For administration purposes only, AGD will immediately reboot. |

Figure 6:
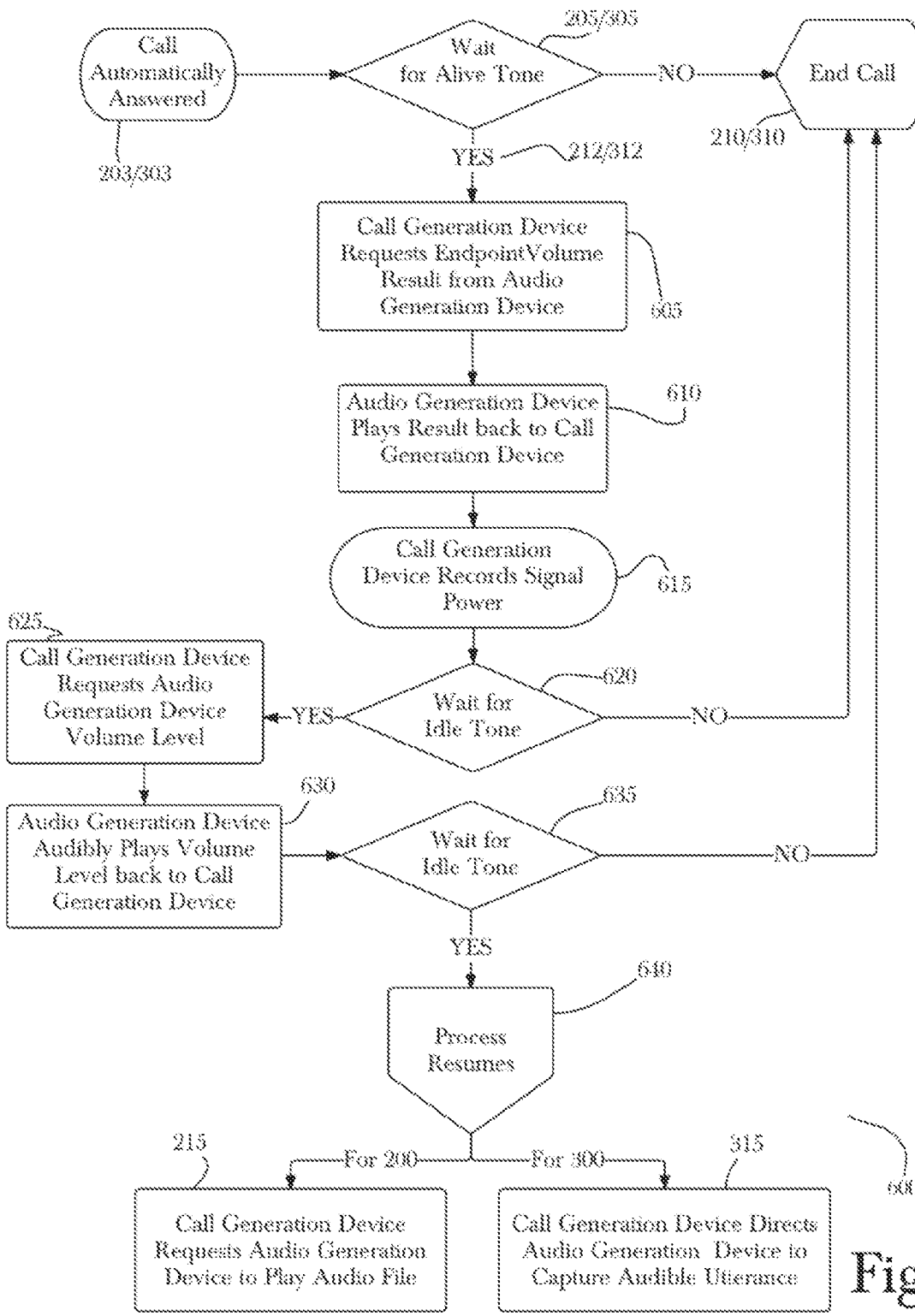
FIG. 6 is a process flow diagram of a method that may be used to set and check necessary settings and conditions prior to completing the method as depicted in FIG. 2 or the method as depicted in FIG. 3.

FIG. 6 illustrates a method 600 which may be inserted into either method 200 or method 300, interjected between method steps 212 and 215 or 312 and 315, respectively, and in this example, allows for volume settings and signal power adjustments to be made prior to proceeding to either step 215 or 315. It is crucial that volume settings on both communication endpoint 150 and the connected audio generation device 170 are aligned and balanced in order to obtain accurate MOS results. If volume settings are not balanced between communication endpoint 150 and audio generation device 170, skewed MOS results may occur. Accordingly, the inventor has conceived and reduced to practice, in a preferred embodiment of the invention, a prescribed list of settings for specific communication endpoint 150 makes and models, along with their corresponding preferred volume settings for the connected audio generation device 170. In an instance where call generation device 110 determines that volume settings may be imbalanced, method 600 may be executed. Call generation device 110 waits 205/305 to receive an alive tone 425/525 from audio generation device 170 before requesting communication endpoint volume result 605. Audio generation device 170 plays 610 result back to call generation device 110, which records signal power 615. Call generation device 110 waits for audio generation device 170 to become idle 620 before requesting audio generation device 170 volume level 625. In response, audio generation device 170 plays volume level 630 back to call generation device 110 then transitions to an idle state 635 whereby the elected process method resumes 640. Either method 200 resumes via method step 215, or method 300 resumes via method step 315.

Figure 7:
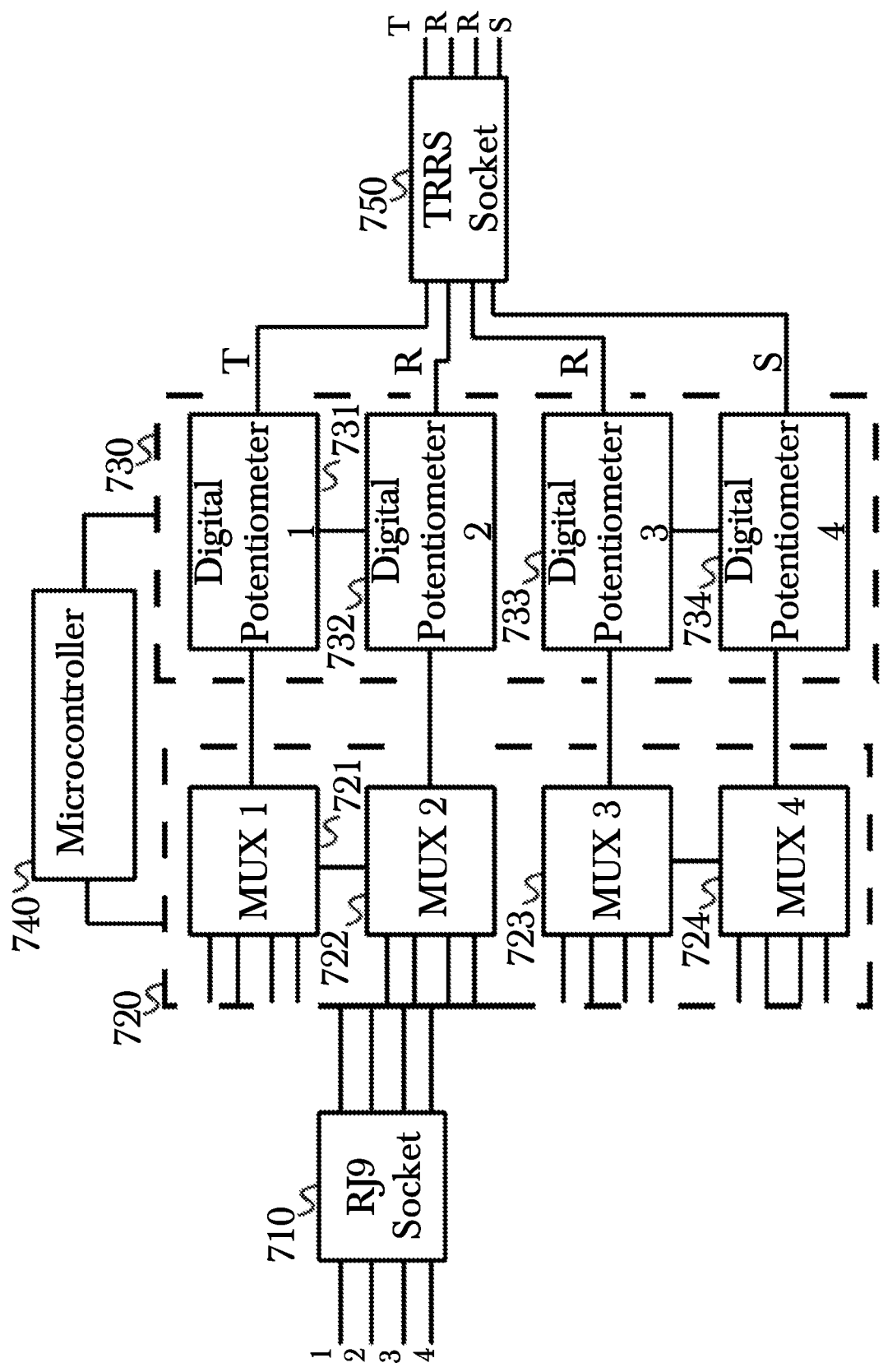
FIG. 7 is a system diagram of a preferred embodiment of a device for mapping and line leveling of pins from an RJ9 socket to a TRRS socket.

FIG. 7 is a system diagram of a preferred embodiment of a device for mapping and line leveling of pins from an RJ9 socket to a TRRS socket. An RJ9 socket 710, commonly used for handsets for telephone equipment, is present, and has each pin forwarded to a set of 720. Each pin is labeled with a number, 1, 2, 3, and 4, on FIG. 7, and connects to a series of multiplexers 720. Each pin from an RJ9 jack 710 connects to the corresponding input pin on each of four multiplexers 721, 722, 723, and 724, in other words, pin 1 connects to the corresponding first input pin of each of the four multiplexers 720, pin 2 connects to the corresponding second input pin of each multiplexer, and so on for all four input pins 1, 2, 3, and 4. Multiplexers 721 and 722 may be connected to each other by being on the same component, that is a two-multiplexer circuit component, and likewise, multiplexers 723 and 724 may be on another component together. Each multiplexer then forwards any input, using a given input configuration for each, to a group of digital potentiometers or "digipots" 730. For a multiplexer 721, output is wired to a digital potentiometer 731. Likewise, for a multiplexer 722, output is wired to a digipot 732, and for a multiplexer 723, output is wired to a digipot 733, and finally for a multiplexer 724, output is wired to a digipot 734. Two digital potentiometers may be connected and on the same circuit component, as in a similar case to two given multiplexers 720. For example, as shown in FIG. 7, a digital potentiometer 731 may be connected to a digital potentiometer 732, and a digital potentiometer 733 may be connected to a fourth potentiometer 734. At least one microcontroller device 740 may use software programming to control the configurations of a system of multiplexers 720 and digital potentiometers 730, which may be programmed beforehand to alter configurations of multiplexers 720 and digital potentiometers 730 under varying circumstances, determined by input from an RJ9 socket 710. Digital potentiometers 730 may be used in a resistor-ladder configuration to match impedance of incoming signals from 720, before sending resulting signals to a Tip-Ring-Ring-Sleeve (TRRS) socket 750, whereby, using this circuitry, a headset having a TRRS-type audio jack may be used with telephone equipment having an RJ9 telephone connector socket, without loss of quality of functionality due to configuration discovery as illustrated in FIG. 8.

Figure 8:
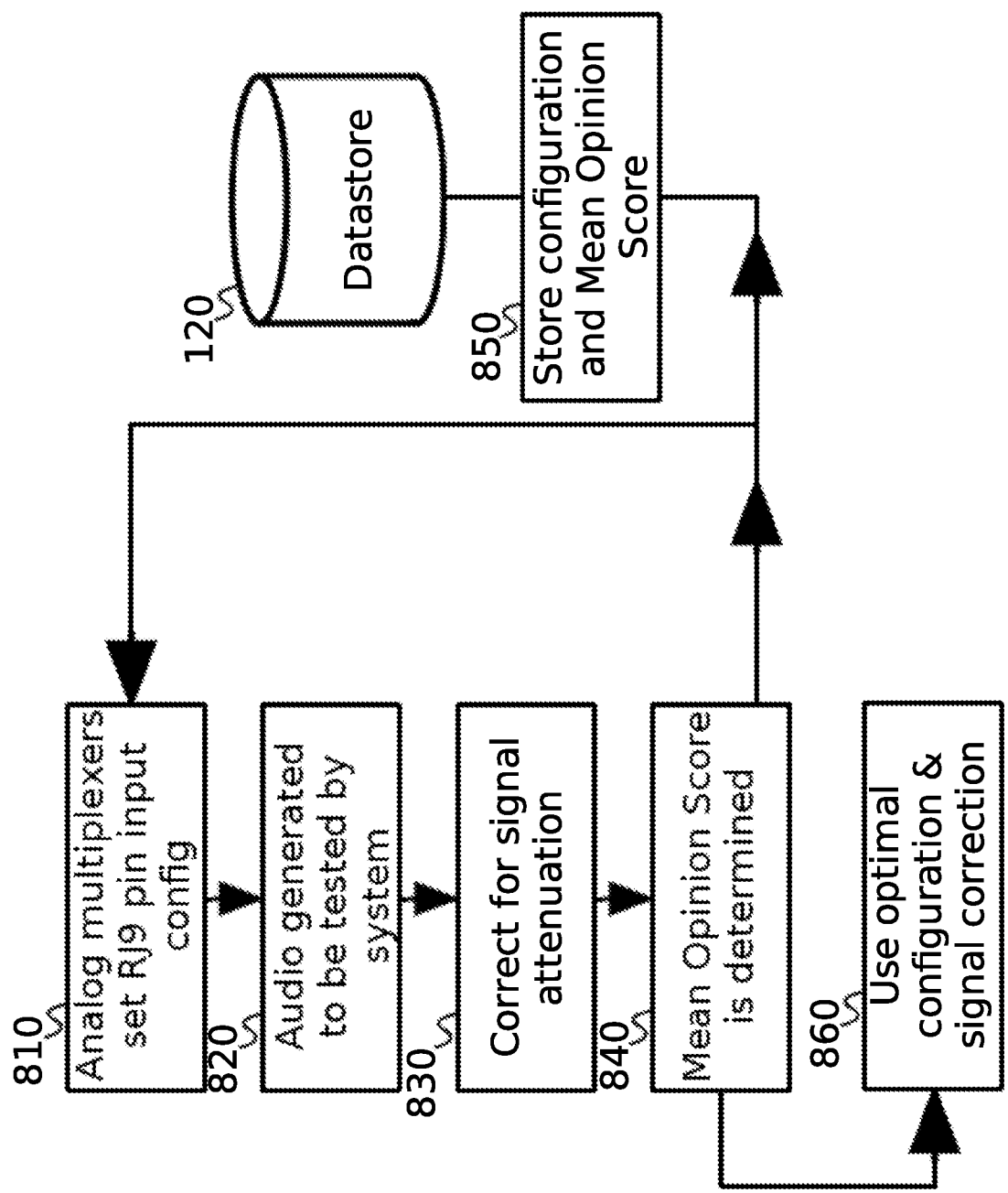
FIG. 8 is a block diagram of a method of configuration discovery for novel or unknown configurations, according to an aspect.

FIG. 8 is a block diagram of a method of configuration discovery for novel or unknown configurations, according to an aspect. In the event that an RJ9 pin configuration is not known, such as in the case of a novel or unknown phone headset design entering the market, 720 will use a first input configuration 810, before audio is generated by an audio generation device 170, 820, to be used for testing the chosen pin configuration 810. Using at least one digital potentiometer ("digipot") 930, 731, 732, 733, 734, signal attenuation may be compensated for 830 by comparing signal strengths and using a resistor-ladder approach to normalize signal strengths in the system. Using a method for a Mean Opinion Score (MOS) of audio quality based on either FIG. 2 or FIG. 3 (as described above), 840, the results and Mean Opinion Score (MOS) of the test are recorded 850 in a datastore 120. Configurations are attempted procedurally over and over with new pin input configurations being chosen 810 for both multiplexers 720, with results 840 of audio tests 820 as in FIG. 2 and FIG. 3 being recorded in a datastore 120. When all configurations have been attempted, an optimal configuration is chosen from all tested configurations 860, the optimal configuration being one which has the highest MOS of all tested configurations. In this way, a novel phone device may be procedurally tested for pin configurations in its headset jack, in order to find an optimal pin mapping for use in audio generation, if such a configuration is not already known.

Figure 9:
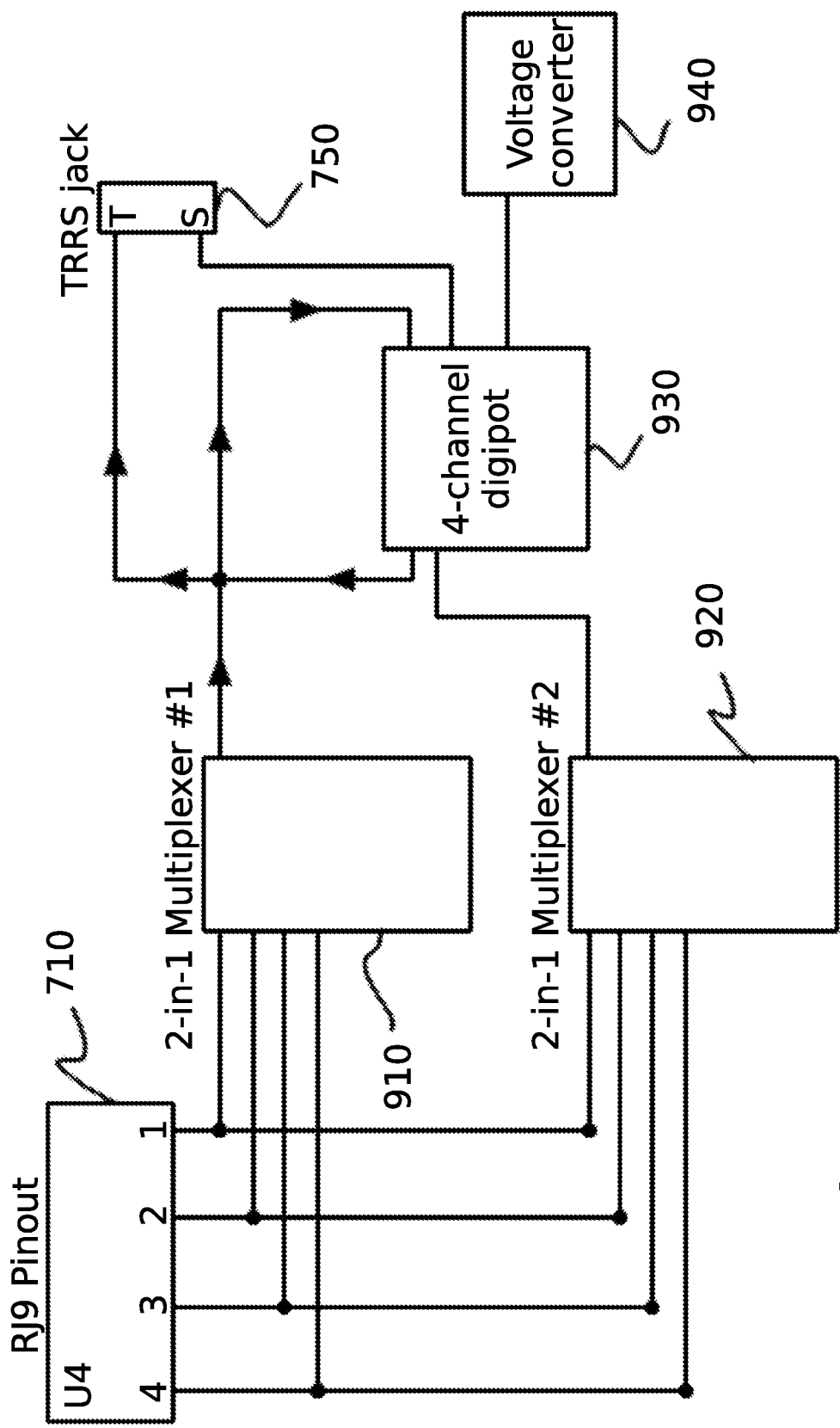
FIG. 9 is an exemplary system diagram of another preferred embodiment of a device for mapping and line leveling of pins from an RJ9 socket to a TRRS socket.

FIG. 9 is an exemplary system diagram of another preferred embodiment of a device for mapping and line leveling of pins from an RJ9 socket to a TRRS socket. An RJ9 jack 710, commonly used for headset technology in phone landlines, is present, and has each pin forwarded to a set of 910,

920. In this embodiment, each multiplexer is a 2-in-1 4-channel multiplexer 910, 920, which means that each component is a chip that contains two 4-input multiplexers on it, for a functional total of four multiplexers, similar to FIG. 7. Each pin is labeled with a number, 1, 2, 3, and 4, on FIG. 7, and connects to a series of multiplexers 910, 920.

Each pin from an RJ9 jack 710 connects to the corresponding input pin on each of four multiplexers 910, 920, in other words, pin 1 connects to the corresponding first input pin of each input channel on all four multiplexers 910, 920, pin 2 connects to the corresponding second input pin of each multiplexer, and so on for all four input pins 1, 2, 3, and 4. Each multiplexer then forwards any input, using a given input configuration for each, to a 4-channel digital potentiometer ("digipot") 930. A digipot 930 may be used in a resistor-ladder configuration to match impedance of incoming signals from 910, 920, before sending resulting signals to a Tip-Ring-Ring-Sleeve (TRRS) socket 750, whereby, using this circuitry, a headset using an RJ9 jack 710 configuration, may be optimized and converted to being used in a TRRS jack, without loss of quality of functionality due to configuration discovery as illustrated in FIG. 8. A voltage converter 940 may be present in the circuit for the purpose of converting inconsistent voltages to a consistent voltage, for the purpose of reducing noise in the circuit.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit ("ASIC"), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 10:
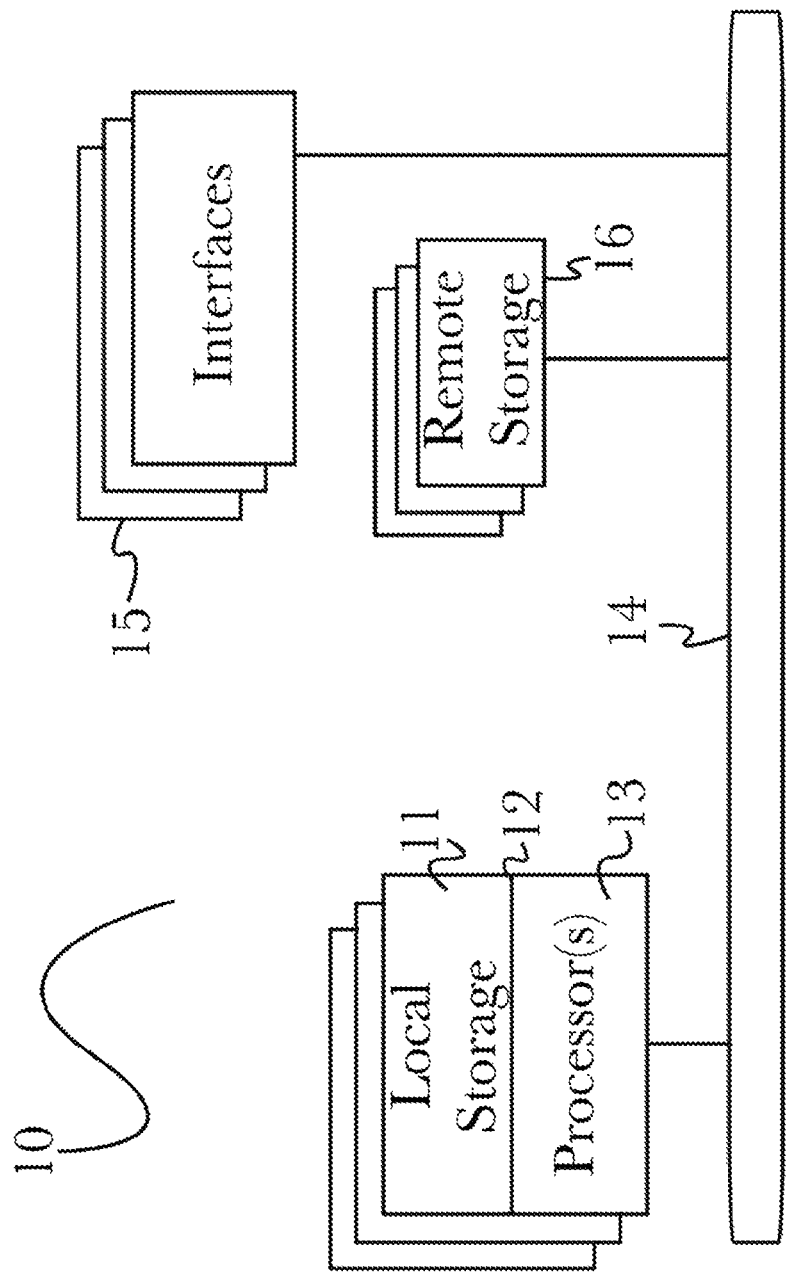
FIG. 10 is a block diagram illustrating an exemplary hardware architecture of a computing device.

Referring now to FIG. 10, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one embodiment, a computing device 10 may be configured or designed to function as a server system utilizing CPU 12, local memory 11 and/or remote memory 16, and interface(s) 15. In at least one embodiment, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a specific embodiment, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 1502.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 10 illustrates one specific architecture for a computing device 10 for implementing one or more of the inventions described herein, it is by no means the only device architecture on which at least a portion of the features and techniques described herein may be implemented. For example, architectures having one or any number of processors 13 may be used, and such processors 13 may be present in a single device or distributed among any number of devices. In one embodiment, a single processor 13 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a java virtual machine or equivalent, or files containing higher level code that may be executed by the computer using an interpreter (for example, scripts written in Python, Perl, Ruby, Groovy, or any other scripting language).

Figure 11:
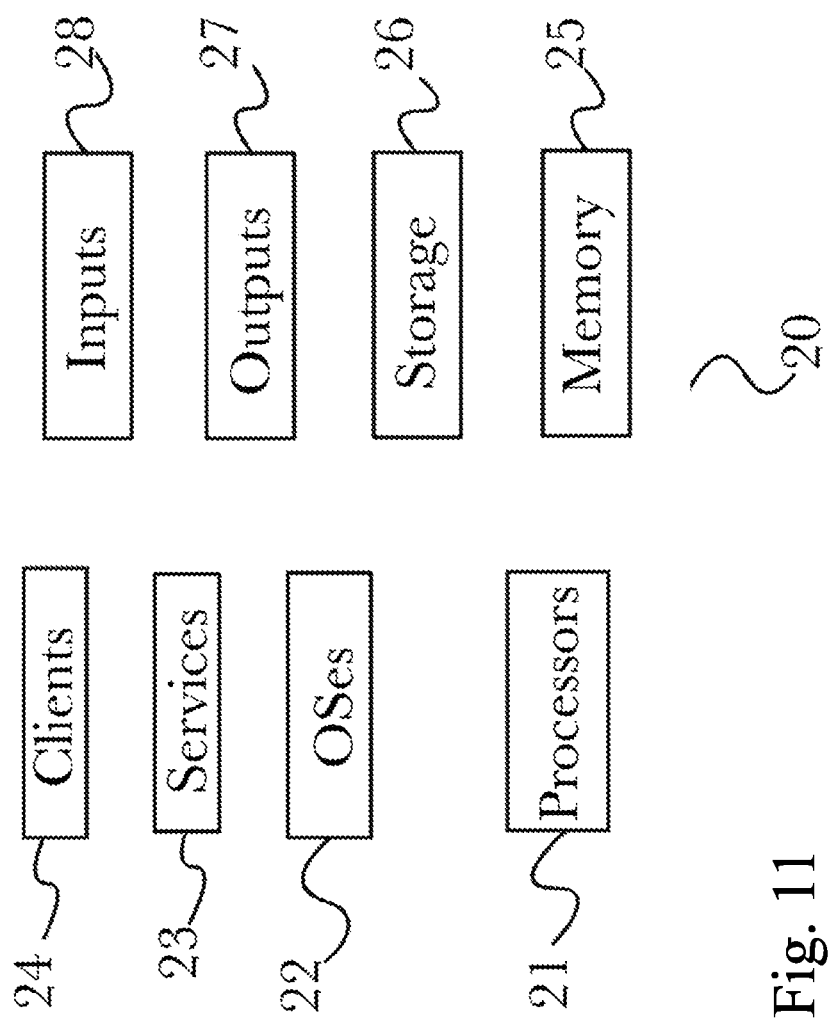
FIG. 11 is a block diagram illustrating an exemplary logical architecture for a client device.

In some embodiments, systems according to the present invention may be implemented on a standalone computing system. Referring now to FIG. 11, there is shown a block diagram depicting a typical exemplary architecture of one or more embodiments or components thereof on a standalone computing system. Computing device 20 includes processors 21 that may run software that carry out one or more functions or applications of embodiments of the invention, such as for example a client application 24. Processors 21 may carry out computing instructions under control of an operating system 22 such as, for example, a version of MICROSOFT WINDOWS™ operating system, APPLE OSX™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 10). Examples of storage devices 26 include flash memory, magnetic hard drive, CD-ROM, and/or the like.

Figure 12:
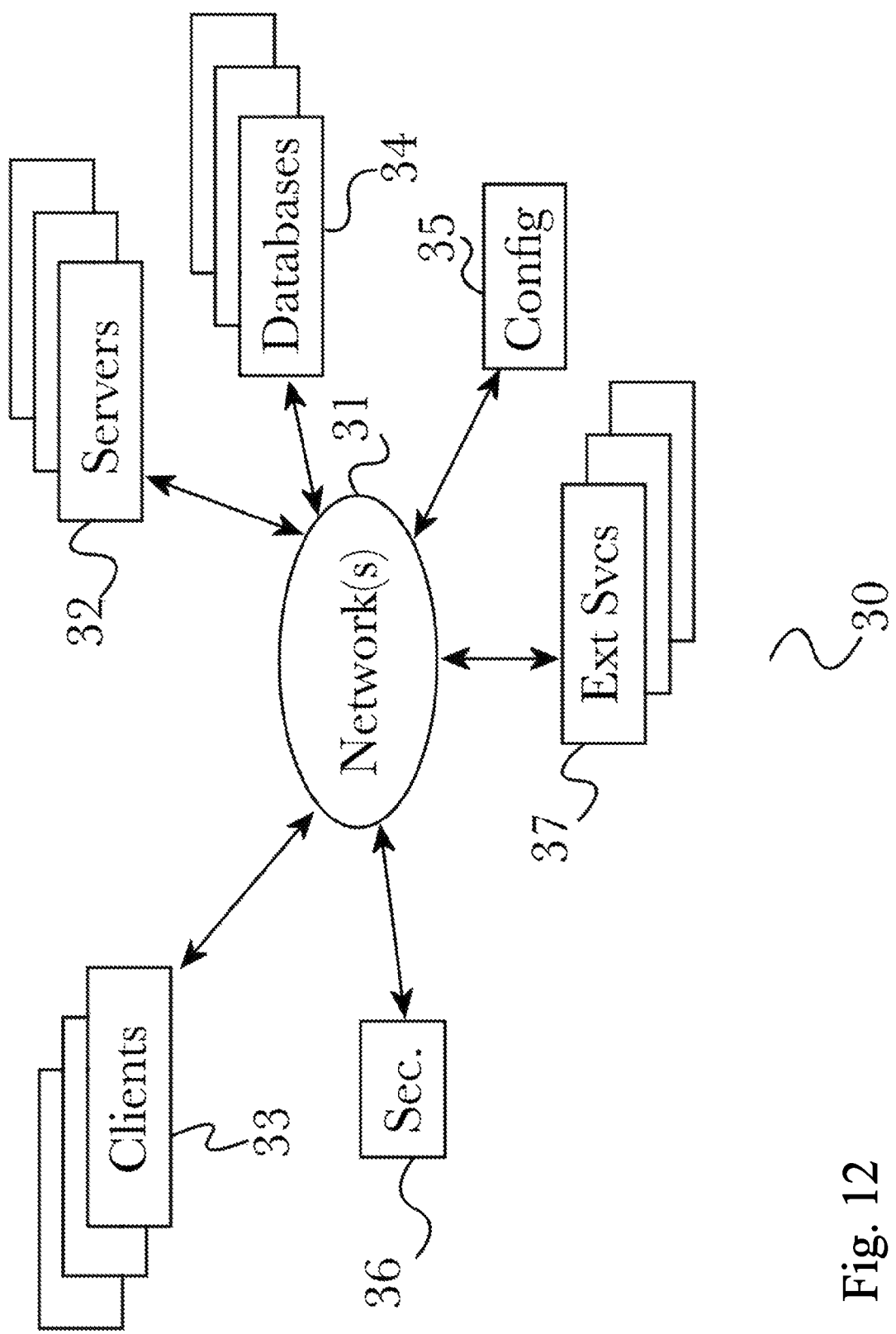
FIG. 12 is a block diagram showing an exemplary architectural arrangement of clients, servers, and external services.

In some embodiments, systems of the present invention may be implemented on a distributed computing network, such as one having any number of clients and/or servers. Referring now to FIG. 12, there is shown a block diagram depicting an exemplary architecture 30 for implementing at least a portion of a system according to an embodiment of the invention on a distributed computing network. According to the embodiment, any number of clients 33 may be provided. Each client 33 may run software for implementing client-side portions of the present invention; clients may comprise a system 20 such as that illustrated in FIG. 11. In addition, any number of servers 32 may be provided for handling requests received from one or more clients 33.

Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, WiMAX, LTE, and so forth), or a local area network (or indeed any network topology known in the art; the invention does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-cabled services or functionality related to or installed on the hardware device itself. For example, in an embodiment where client applications 24 are implemented on a smartphone or other electronic device, client applications 24 may obtain information stored in a server system 32 in the cloud or on an external service 37 deployed on one or more of a particular enterprise's or user's premises.

In some embodiments of the invention, clients 33 or servers 32 (or both) may make use of one or more specialized services or appliances that may be deployed locally or remotely across one or more networks 31. For example, one or more datastores 34 may be used or referred to by one or more embodiments of the invention. It should be understood by one having ordinary skill in the art that datastores 34 may be arranged in a wide variety of architectures and using a wide variety of data access and manipulation means. For example, in various embodiments one or more datastores 34 may comprise a relational datastore system using a structured query language (SQL), while others may comprise an alternative data storage technology such as those referred to in the art as "NoSQL" (for example, HADOOP CASSANDRA™, GOOGLE BIGTABLE™, and so forth). In some embodiments, variant datastore architectures such as column-oriented datastores, in-memory datastores, clustered datastores, distributed datastores, or even flat file data repositories may be used according to the invention. It will be appreciated by one having ordinary skill in the art that any combination of known or future datastore technologies may be used as appropriate, unless a specific datastore technology or a specific arrangement of components is specified for a particular embodiment herein. Moreover, it should be appreciated that the term "datastore" as used herein may refer to a physical datastore machine, a cluster of machines acting as a single datastore system, or a logical datastore within an overall datastore management system. Unless a specific meaning is specified for a given use of the term "datastore", it should be construed to mean any of these senses of the word, all of which are understood as a plain meaning of the term "datastore" by those having ordinary skill in the art.

Similarly, most embodiments of the invention may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 36 or configuration system 35 or approach is specifically required by the description of any specific embodiment.

Figure 13:
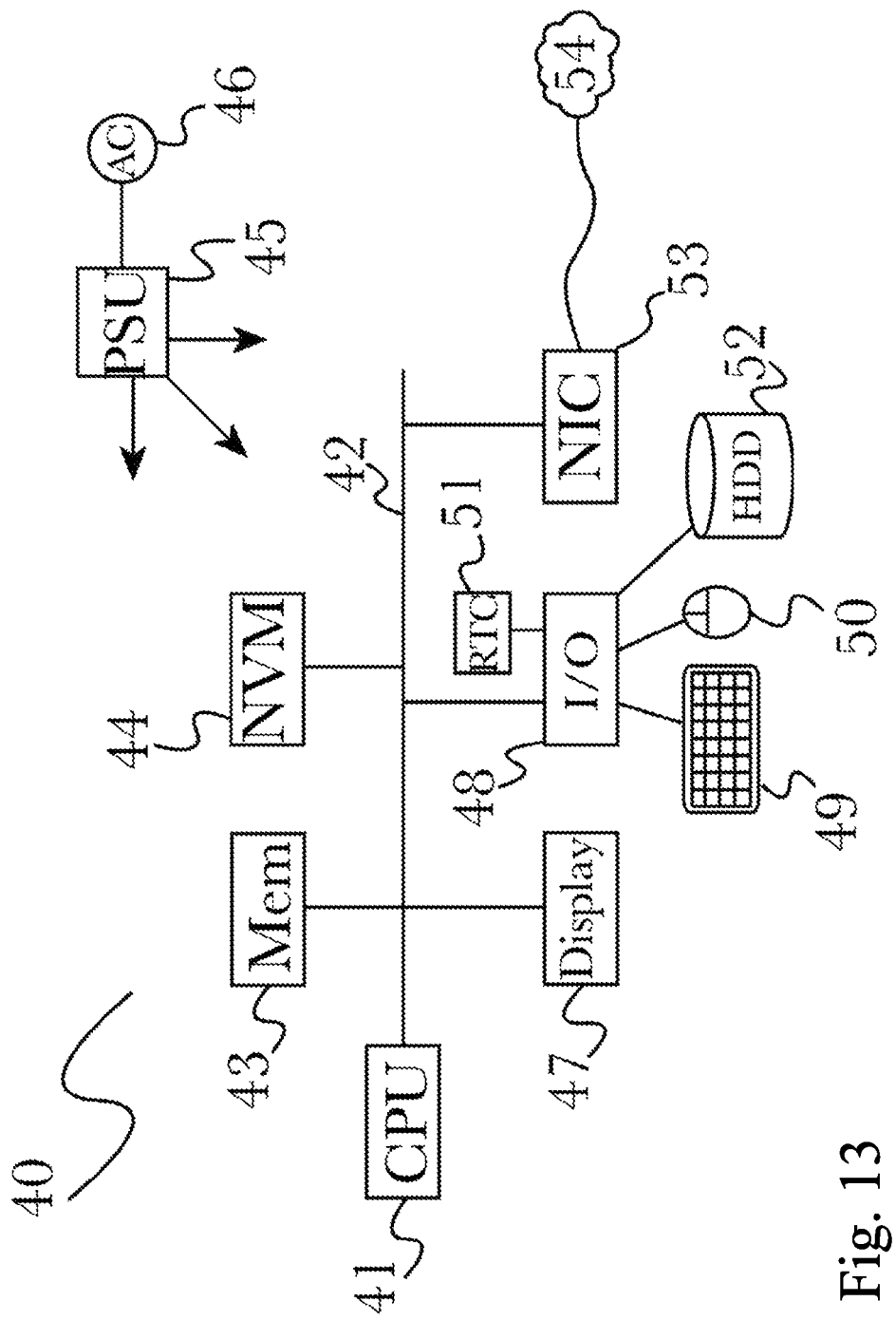
FIG. 13 is another block diagram illustrating an exemplary hardware architecture of a computing device.

FIG. 13 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of the present invention may be distributed among any number of client and/or server components. For example, various software modules may be implemented for performing various functions in connection with the present invention, and such modules may be variously implemented to run on server and/or client components.

The skilled person will be aware of a range of possible modifications of the various embodiments described above. Accordingly, the present invention is defined by the claims and their equivalents.

What is claimed is:

1. A device for adapting electrical connectors, comprising:
a plurality of multiplexers capable of interfacing with a controller;
a plurality of potentiometers capable of interfacing with a controller; and
a controller comprising a processor, a memory, and a plurality of programming instructions, wherein the programming instructions, when acting on the processor, cause the controller to:
receive a configuration for mapping of electrical signals;
configure the plurality of multiplexers to map electrical signals between each of a plurality of electrical connectors, based on the received configuration; and
configure the plurality of potentiometers to adjust the impedance of the electrical signals between each of the plurality of electrical connectors, based on the received configuration,
whereby signals received at a first electrical connector of the plurality of electrical connectors will be passed through to a second electrical connector of the plurality of electrical connectors, based on the received configuration.

2. The device of claim 1, further comprising:
a configuration test module, which:
generates a test signal; transmits the test signal from the first electrical connector of the plurality of electrical connectors to the second electrical connector of the plurality of electrical connectors; and
confirms the receipt and quality of the test signal at the second of the plurality of electrical connectors corresponding to the configuration.

3. The device of claim 1, wherein an audio line driver is connected to the multiplexers, for the purpose of separating either input signal received, into a balanced output pair, using differential output amplification.

4. The device of claim 1, wherein a DC-to-DC converter regulates input power to a constant voltage in the circuit and provides galvanic isolation for the ground line in the circuitry, to avoid problems due to dirty power and avoid AC hum.

5. An automated device for adapting electrical connectors, comprising:
a plurality of multiplexers capable of interfacing with a controller;
a plurality of potentiometers capable of interfacing with a controller;
a controller comprising a processor, a memory, and a plurality of programming instructions, wherein the programming instructions, when acting on the processor, cause the controller to:
detect an electrical signal from a connection at a first electrical connector;
cycle through configurations for mapping of electrical signals;
configure the plurality of multiplexers to map electrical signals between each of a plurality of electrical connectors, based on the current configuration cycle; and
configure the plurality of potentiometers to adjust the impedance of the electrical signals between each of the plurality of electrical connectors, based on the current configuration cycle,
test the current configuration cycle for connectivity and signal quality at each of the plurality of electrical connectors; and
select the most appropriate configuration;
whereby, when an electrical signal is detected at the first electrical connector, the device will automatically determine the correct configuration, and signals received at the first electrical connector will be passed through to a second electrical connector based on the determined configuration.

6. The device of claim 5, further comprising:
a signal generator, which:
generates a test signal;
transmits the test signal from the first electrical connector to a second electrical connector, based on the selected configuration; and
confirms the receipt and quality of the test signal at the second electrical connector corresponding with the configuration;
wherein the generation and confirmation of the test signal assists the controller in confirming the appropriate selection of configurations.

7. The device of claim 5, wherein an audio line driver is connected to the multiplexers, for the purpose of separating either input signal received, into a balanced output pair, using differential output amplification.

8. The device of claim 5, wherein a DC-to-DC converter regulates input power to a constant voltage in the circuit and provides galvanic isolation for the ground line in the circuitry, to avoid problems due to dirty power and avoid AC hum.

9. A method for adapting electrical connectors, comprising the steps of:
receiving, at a controller, a configuration for mapping of electrical signals;
configuring a plurality of multiplexers to map electrical signals between each pin of the telephone connector and the corresponding pin of the audio connector, based on the configuration; and
configuring a plurality of potentiometers to map electrical signals between each of a plurality of electrical connectors, based on the received configuration;
whereby signals received at a first electrical connector of the plurality of electrical connectors will be passed through to a second electrical connector of the plurality of electrical connectors, based on the received configuration.

10. The method of claim 9, further comprising the steps of:
generating a test signal;
transmitting the test signal from a first electrical connector of the plurality of electrical connectors to a second electrical connector of the plurality of electrical connectors; and
confirming the receipt and quality of the test signal at the second electrical connector corresponding to the configuration.

11. The method of claim 9, comprising the further step of connecting an audio line driver to the multiplexers, for the purpose of separating either input signal received, into a balanced output pair, using differential output amplification.

12. The method of claim 9, comprising the further step of using a DC-to-DC converter to regulate input power to a constant voltage in the circuit and provides galvanic isolation for the ground line in the circuitry, to avoid problems due to dirty power and avoid AC hum.

13. A method for automatically adapting electrical connectors, comprising the steps of:
detecting an electrical signal at an electrical connector;
cycling through configurations for mapping of electrical signals;
configuring a plurality of multiplexers to map electrical signals between each of a plurality of electrical connectors, based on the current configuration cycle;
configuring a plurality of potentiometers to adjust the impedance of the electrical signals between each of the plurality of electrical connectors, based on the current configuration cycle;
testing the current configuration cycle for connectivity and signal quality at each of the plurality of electrical connectors; and
selecting the most appropriate configuration;
whereby, when an electrical signal is detected at the first electrical connector, the device will automatically determine the correct configuration, and signals received at the first electrical connector will be passed through to a second electrical connector based on the determined configuration.

14. The method of claim 13, further comprising the steps of:
- generating a test signal;
- transmitting the test signal from a first electrical connector of the plurality of electrical connectors to a second electrical connector of the plurality of electrical connectors; and
- confirming the receipt and quality of the test signal at the second electrical connector corresponding to the configuration;
- wherein the generation and confirmation of the test signal assists the controller in confirming the appropriate selection of configurations.

15. The method of claim 13, comprising the further step of connecting an audio line driver to the multiplexers, for the purpose of separating either input signal received, into a balanced output pair, using differential output amplification.

16. The method of claim 13, comprising the further step of using a DC-to-DC converter to regulate input power to a constant voltage in the circuit and provides galvanic isolation for the ground line in the circuitry, to avoid problems due to dirty power and avoid AC hum.

* * * * *